(12) United States Patent
Nainani et al.

(10) Patent No.: US 9,218,973 B2
(45) Date of Patent: Dec. 22, 2015

(54) METHODS OF DOPING SUBSTRATES WITH ALD

(71) Applicant: Applied Materials, Inc., Santa Clara, CA (US)

(72) Inventors: Aneesh Nainani, Palo Alto, CA (US); Mathew Abraham, Mountain View, CA (US); Er-Xuan Ping, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/917,039

(22) Filed: Jun. 13, 2013

(65) Prior Publication Data

US 2014/0004689 A1 Jan. 2, 2014

Related U.S. Application Data

(60) Provisional application No. 61/660,330, filed on Jun. 15, 2012.

(51) Int. Cl.
*H01L 21/22* (2006.01)
*H01L 21/225* (2006.01)
*H01L 29/66* (2006.01)

(52) U.S. Cl.
CPC .......... *H01L 21/225* (2013.01); *H01L 21/2254* (2013.01); *H01L 29/66803* (2013.01)

(58) Field of Classification Search
CPC ......... H01L 21/00; H01L 27/00; H01L 29/00; H01L 25/00
USPC .......................................................... 438/542
See application file for complete search history.

(56) References Cited

U.S. PATENT DOCUMENTS

| | | | |
|---|---|---|---|
| 5,186,718 A | 2/1993 | Tepman et al. | |
| 8,569,158 B2 * | 10/2013 | Clark | 438/559 |
| 8,580,664 B2 * | 11/2013 | Clark | 438/558 |
| 8,890,299 B2 * | 11/2014 | Sadaka et al. | 257/686 |
| 2008/0164582 A1 * | 7/2008 | Govindarajan | 257/635 |
| 2010/0062603 A1 | 3/2010 | Ganguly et al. | |
| 2012/0018702 A1 * | 1/2012 | Javey et al. | 257/14 |
| 2012/0028454 A1 * | 2/2012 | Swaminathan et al. | 438/558 |
| 2012/0252196 A1 * | 10/2012 | Clark | 438/542 |
| 2012/0252197 A1 * | 10/2012 | Clark | 438/559 |
| 2012/0313237 A1 * | 12/2012 | Sadaka et al. | 257/734 |
| 2013/0153027 A1 * | 6/2013 | Youngbull et al. | 136/257 |

* cited by examiner

*Primary Examiner* — Telly Green
(74) *Attorney, Agent, or Firm* — Servilla Whitney LLC

(57) ABSTRACT

Provided are methods of doping substrates and making doped semiconductor features. An exemplary method includes providing a substrate having at least one feature having an aspect ratio; depositing a layer of dopants onto the substrate, the layer of dopants having a shape conforming to the at least one feature. A dielectric layer is deposited onto the layer of dopants, the dielectric layer having a shape conforming to the layer of dopants. The dielectric layer is annealed to diffuse the dopants into the substrate.

12 Claims, 6 Drawing Sheets

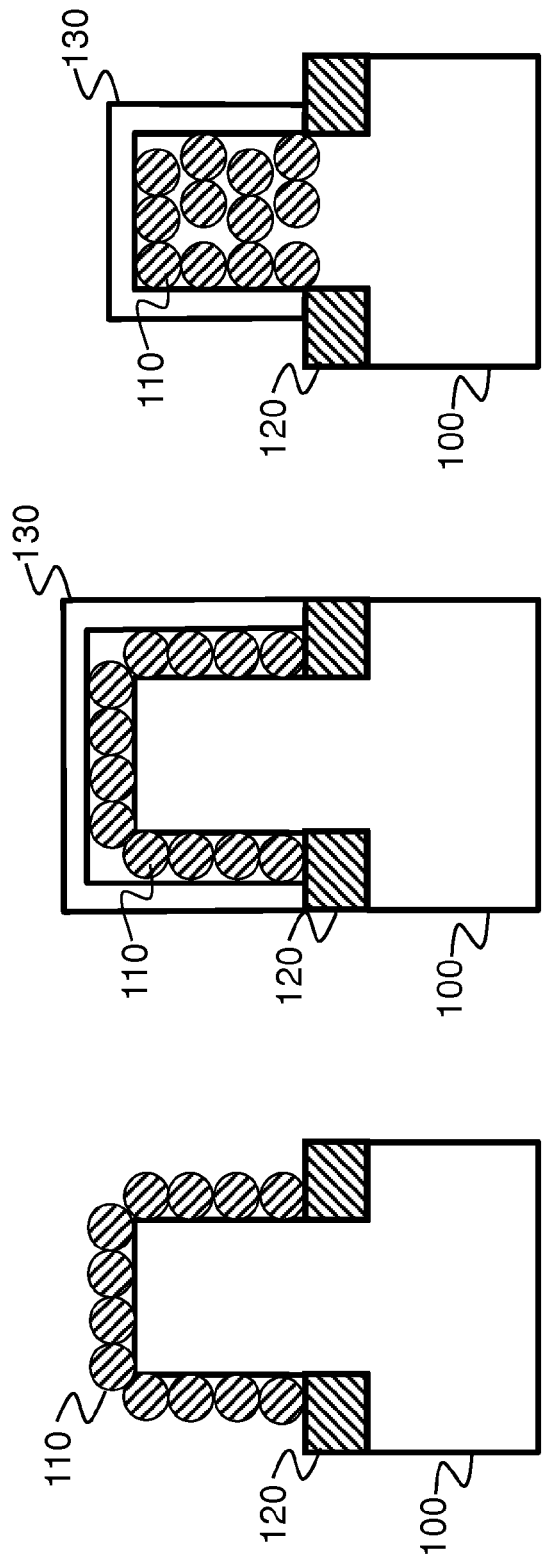

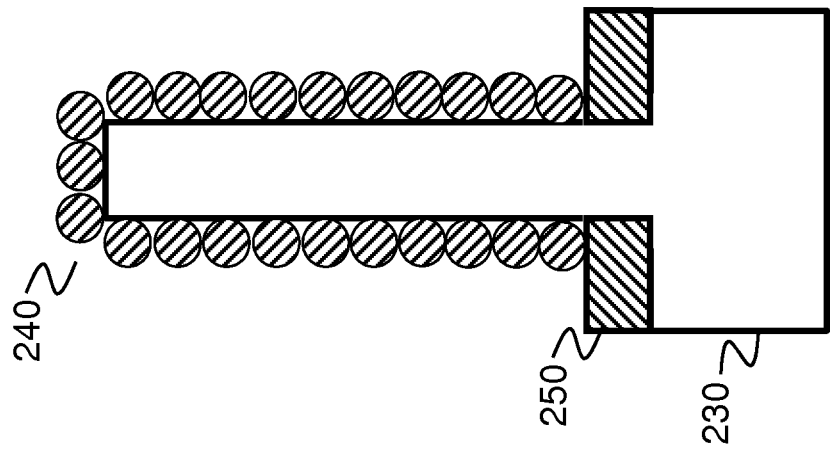
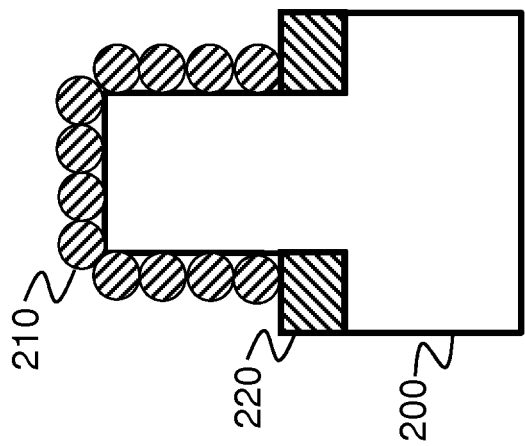
Fig. 2B
Fig. 2A

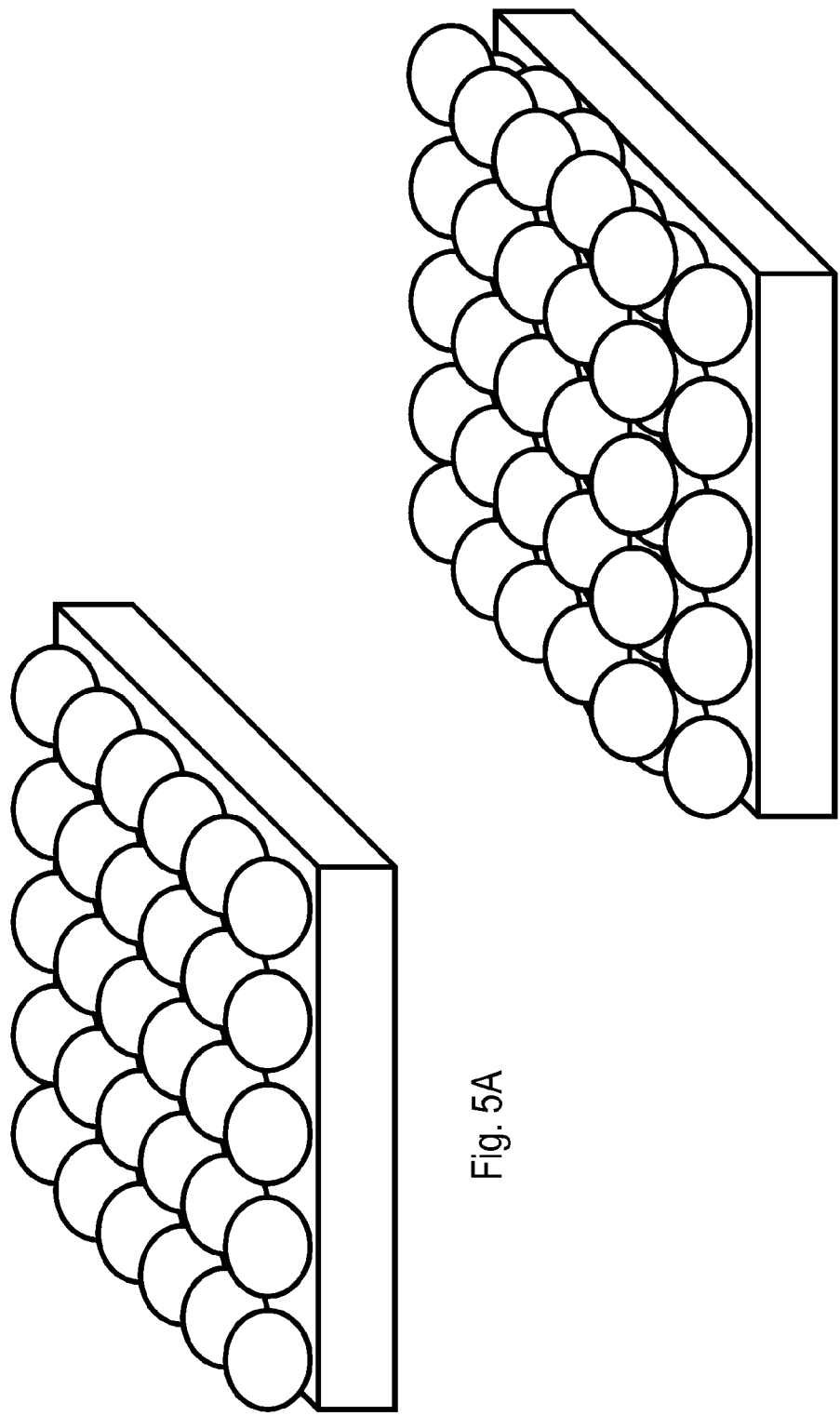

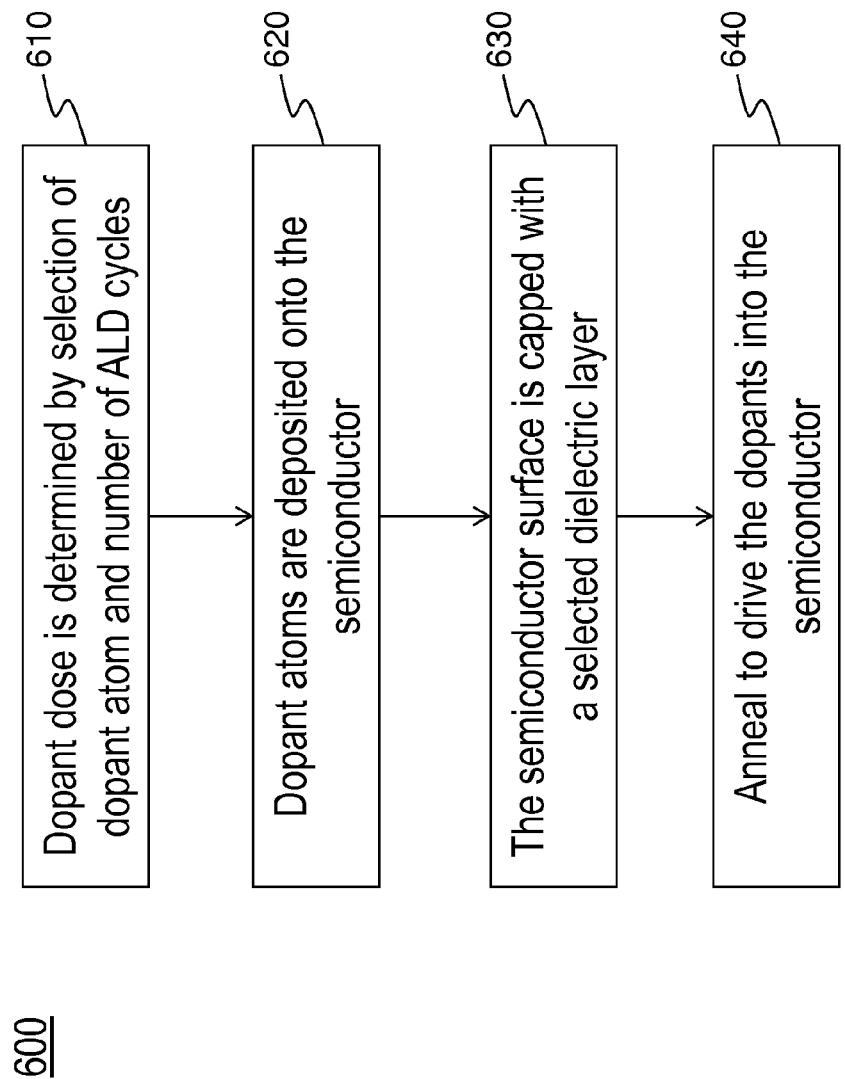

METHODS OF DOPING SUBSTRATES WITH ALD

CROSS-REFERENCE TO RELATED APPLICATION

This application claims priority to U.S. Provisional Application No. 61/660,330, filed Jun. 15, 2012, the entire contents of which are incorporated herein by reference.

FIELD

Embodiments of the present invention pertain to methods, systems and apparatus for doping semiconductor substrates. In particular, methods suitable for doping FinFET transistors are disclosed.

BACKGROUND

Semiconductor doping involves intentionally introducing impurities into a substrate in order to control its electrical properties. As such, doping methods are very important in the semiconductor industry. However, many of the currently known methods for doping substrates utilize harsh conditions, which may cause irreparable damage. For example, plasma immersion ion implantation is performed by generating a plasma containing ions of species to be implanted in a semiconductor wafer or workpiece. The plasma may be generated using a plasma source such as a toroidal plasma source at the reactor chamber ceiling. Ion energy sufficient to achieve a desired ion implantation depth profile below the wafer surface is provided by coupling a very high RF bias voltage (e.g., 10 kV to 20 kV) to the semiconductor wafer through an insulated cathode electrode within the wafer support pedestal. High implant dose rates require a high plasma ion density, which is achieved using a toroidal plasma source operating at a low chamber pressure. The requisite ion implant depth profile requires a very high ion energy, which is achieved by applying a very high RF bias voltage across the plasma sheath at the wafer surface. The process gas employed in plasma immersion ion implantation can be a fluoride or a hydride of the dopant species to be implanted. Such a process involves harsh conditions, which are not suitable for some types of substrates.

There is therefore a need for gentler methods which do not harm the underlying substrate. Additionally, currently known methods of doping transistors often do not yield the conformal and consistent results that are required, particularly in the area of substrates with a high aspect ratio, such as is found with FinFET transistors. Thus, there is a continuing need for methods and apparatus for effectively doping finFET transistors.

SUMMARY

One aspect of the invention relates to a method of doping a semiconductor feature. The method comprises providing a substrate having at least one feature having an aspect ratio; depositing a layer of dopants onto the substrate, the layer of dopants having a shape conforming to the at least one feature; depositing a dielectric layer onto the layer of dopants, the dielectric layer having a shape conforming to the layer of dopants; and annealing the dielectric layer to diffuse the dopants into the substrate.

The dopant dosage can be determined using the dopant atom size and by what method of deposition is utilized. In one or more embodiments, the dopants comprise one or more of boron, phosphorous, arsenic, silicon, or combinations thereof. In one or more embodiments, the layer of dopants comprises one or more monolayers. In some embodiments, the method of deposition of the layer of dopants comprises atomic layer deposition or plasma-enhanced atomic layer deposition. Thus, in one or more embodiments, depositing a layer of dopants comprises depositing a predetermined number of monolayers to provide a desired dose of dopants. In a further embodiment, each monolayer is deposited by a single atomic layer deposition cycle. In one or more embodiments, substantially all of the dopants are diffused into the substrate less than 0.05 nm from the surface. In one or more embodiments, the semiconductor feature is a FinFET transistor.

The dielectric layer can selected from any suitable material. Thus, in one or more embodiments, the dielectric layer comprises SiN, $SiO_2$, $Al_2O_3$, or $HfO_2$. The dielectric layer may deposited via any suitable method, including but not limited to, atomic layer deposition, chemical vapor deposition, or sputtering. In one embodiment, deposition of the dielectric layer is carried out at a temperature of less than about 300° C.

Other embodiments relate to other variations in the method. For example, in one or more embodiments, deposition of the layer of dopants and deposition of the dielectric layer occur without a break in vacuum. In one or more embodiments, the method further comprises implanting silicon or argon into the dielectric layer prior to annealing the dielectric layer. In one or more embodiments, the dopants are diffused into the substrate to a predetermined depth, and the predetermined depth is calculated using the aspect ratio.

A second aspect of the invention relates to a method of doping FinFET transistor. The method comprises depositing a layer of dopants onto a substrate; depositing a dielectric layer onto the layer of dopants; implanting silicon or argon into the dielectric layer prior to annealing the dielectric layer; and annealing the dielectric to diffuse the dopants into the substrate. Any of the variations from the first aspect may be utilized in this aspect. Thus, in one embodiment, the layer of dopants is one or more dopant atoms thick. In another embodiment, the deposition of the layer of dopants comprises atomic layer deposition or plasma-enhanced atomic layer deposition. In one or more embodiments, deposition of the dielectric layer is carried out at a temperature of less than about 300° C. In one or more embodiments, the semiconductor feature is a FinFET transistor. In one or more embodiments, deposition of the layer of dopants and deposition of the dielectric layer occur without a break in vacuum.

A third aspect of the invention also relates to a method of making a doped FinFET transistor. The method comprises depositing more than one monolayer of dopants onto a substrate, wherein the dopants comprise one or more of boron, phosphorous, arsenic, silicon, or combinations thereof; depositing a dielectric layer onto the layer of dopants at a temperature of less than about 300° C., wherein deposition of the layer of dopants and deposition of the dielectric layer occur without a break in vacuum, and wherein the dielectric layer comprises SiN, $SiO_2$, $Al_2O_3$, or $HfO_2$, and is deposited via atomic layer deposition, chemical vapor deposition, or sputtering; implanting silicon or argon into the dielectric layer prior to annealing the dielectric layer; and annealing the dielectric to diffuse the dopants into the substrate.

FIGURES

FIGS. 1A-1C show a doping process in accordance with one or more embodiments of the invention;

FIGS. 2A-2B show two substrates with a layer of dopants according to one or more of the embodiments of the invention;

Figure 4:
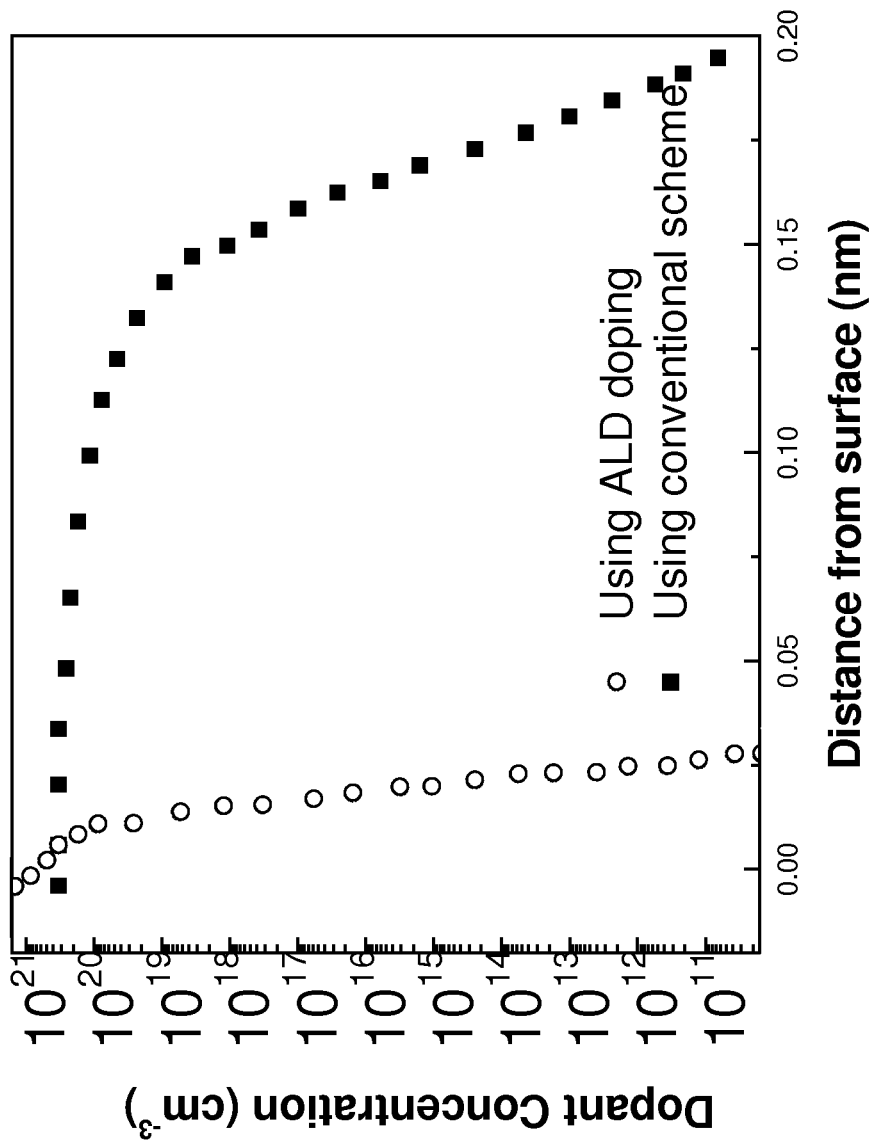

FIG. 4 compares the expected dopant concentration after doping according to a conventional method and doping according to one or more embodiments of the invention;

FIGS. 5A-5B are illustrations of a single and double monolayer of dopants; and

FIG. 6 is a flowchart representing one or more embodiments of the invention.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

In one or more embodiments, provided herein are methods and apparatus for a conformal doping scheme using atomic layer deposition with high activation and no implant damage. These embodiments allow for introduction of dopants into semiconductors. One or more embodiments of the invention are also applicable and relevant for doping in III-V and other compound semiconductor materials where doping with conventional methods such as ion implantation causes excessive damage.

Additionally, one or more embodiments are particularly useful for doping features with high aspect ratios, for example in a FinFET transistor. In one or more embodiments, methods are provided that enable very high doping concentration while avoiding the damage that is incurred during conventional doping schemes such as ion implant.

Accordingly, one aspect of the invention relates to a method of making a doped semiconductor feature semiconductor feature. The method comprises providing a substrate having at least one feature having an aspect ratio; depositing a layer of dopants onto the substrate, the layer of dopants having a shape conforming to the at least one feature; depositing a dielectric layer onto the layer of dopants, the dielectric layer having a shape conforming to the layer of dopants; and annealing the dielectric layer to diffuse the dopants into the substrate.

The dopants can be selected from any desired element. Some non-limiting examples of dopants can include but boron, phosphorous, arsenic and antimony which are commonly used n/p-type dopants for group IV semiconductors such as silicon, germanium and silicon germanium. In other embodiments, the dopants could comprise silicon or carbon, which can act as n-type dopants for III-V-based compound semiconductor materials, such as InGaAs or InAs. In one or more embodiments, these dopants can be advantageously deposited onto the substrate using an atomic layer deposition (ALD) process to achieve a high level of conformality. In particular, the use of atomic layer deposition allows the dopant atoms to be conformally deposited on the features, particularly those with high aspect ratios.

Other doping schemes which may be able to achieve conformality of dopants on the substrate surface often require a long (~1 hr) high temperature (120° C.) dip in an organic solvent solution with low flash point to cause the adsorption of the atoms on the surface. This procedure can cause significant damage and is not compatible with large scale semiconductor manufacturing. This procedure can be eliminated according to one or more of the methods described herein.

In another embodiment, ALD can be used to deposit two different dopants. For example, ALD can be used to deposit two different atoms such as antimony and phosphorus, which is equivalent of doing a co-implant in a traditional ion implant process.

Where heavier (higher atomic mass) dopants such as antimony etc. are implanted using conventional implantation techniques to dope III-V and other compound semiconductors, the heavier dopant species can causes significant implant damage. Also, with heavier dopants, it can be difficult to recover/anneal out the implant damage respectively. According to one or more embodiments, the doping methods described herein result in less damage to the substrate compared with ion implantation techniques.

The dielectric layer covers the dopants to prevent the out diffusion of the atoms and to provide a cap to drive the dopant atoms inside. In one or more embodiments, the dielectric layer can be selected from an oxide or nitride deposited by ALD or chemical vapor deposition (CVD). The selection of dielectric material may also be based on the selectivity of dopants diffusivity in the semiconductor versus the dielectric, such that majority of dopants are driven into the substrate. Thus, in one embodiment, the dielectric layer comprises SiN, $SiO_2$, $Al_2O_3$, or $HfO_2$. In one of the embodiment the thickness of the dielectric layer is between 1 nm and 20 nm.

In one or more embodiments, the temperature of the deposition may be kept relatively low in order to prevent desorption of the dopants layer. Thus, in some embodiments, the dielectric layer may be deposited at a temperature of less than about 350° C., 300° C., or 250° C.

Where 3-dimensional features are present, such as in FinFETs, the dielectric layer may be deposited such that it contours to the 3D surface on the Fin. The dielectric layer can be selected according to the desired application, provided that a suitable deposition temperature and level of conformality can be achieved. In one or more embodiments, the dielectric layer can be silicon nitride, silicon oxide, aluminum oxide, hafnium oxide etc. In one or more embodiments, the dielectric layer can be deposited by one or more of ALD, CVD or sputtering.

An additional "knock-in" process may be carried between the dielectric deposition and annealing steps to enhance the incorporation of dopants into the fin, for example with silicon or argon. In this process, silicon and/or argon are implanted into the dielectric layer prior to annealing. In one or more embodiments, this process is carried out using plasma or traditional ion implantation methods. This process helps the dopants on the surface to incorporate into the semiconductor and prevent them from diffusing into the dielectric.

After the dopant layer is capped with the dielectric the dopants are driven into the substrate using an anneal step. Any suitable anneal processes may be used. In one embodiment, a flash anneal process is used, and may be carried out at a temperature of about 800 to about 1050° C. In another embodiment, the process may comprise a millisecond rapid thermal anneal process. In another embodiment, the process may comprise nanosecond anneal using a laser.

In specific embodiments, substantially all of the implantation dopants in the layer of dopants are driven into the substrate. As used in this specification and the appended claims, the term "substantially all" means that more than 80% of the dopants end up in the substrate. This allows for greater control over dosing, as what is dosed in the layer comprising dopants can reliably be driven into the underlying substrate.

FIGS. 1A-1C shows a doping process according to one or more embodiments of the invention. In FIG. 1A, a substrate 100 is provided, which demonstrates a feature. Such a feature may include the "fin" of a FinFET transistor. A shallow trench isolation layer 120 may be deposited, which will prevent doping of the substrate below where the shallow trench isolation layer 120 is deposited. Then, a layer of dopants 110 is deposited onto the exposed substrate. As represented in FIG. 1A, the dopants 110 are deposited conformally over the feature.

The height of semiconductor fin protruding above the shallow trench isolation also defines the junction depth in this scheme. Thus this scheme offers a precise way of controlling the depth of the junction as compared to conventional schemes of doping.

Turning to FIG. 1B, a dielectric layer 130 is deposited over the dopants, conforming to the layer of dopants. The dielectric layer is annealed to yield the doped substrate of FIG. 1C. As shown in FIG. 1C, the dopants 110 have been driven into the substrate, but not into the areas of the substrate covered by the shallow trench isolation layer 120.

In one or more embodiments, the dose of the dopants may be controlled with precision but with fixed quantization by controlling the number of ALD cycles. Important aspects in selecting a particular dose include the atom size of the dopants, the size of the substrate to be doped, the desired elemental content of the doped substrate and the surface orientation of the substrate.

Methods described herein provide the ability to control dosing. In one or more embodiments, the dosage of the dopants in this scheme is controlled in precise but quantized amount by varying the number of dopant monolayers deposited via an ALD process. As used herein, "monoloayer" refers to a layer that consists of a single layer of atoms. As a result, the thickness of the monolayer will be the diameter of the atoms used. FIG. 5A shows an embodiment of a single monolayer, where the monolayer is one atom-thick. FIG. 5B shows an embodiment of two monoloayers, where each monolayer is one atom-thick, but the overall dopant layer is two atoms-thick. FIG. 5B is not intended to show any particular crystal structure, and merely shows a dopant layer containing two monolayers. Thus in one or more embodiments, the term "dopant layer" may encompass a layer with one or more monolayers.

Thus, in one embodiment, a layer of dopants can be deposited such that it is one monolayer thick. In other embodiments, the layer of dopants can be deposited such that it is more than one dopant atom thick (e.g., has more than one monolayer). The quantization levels can be more finely tuned if there is sub monolayer growth per cycle of ALD. Thus, in one or more embodiments, partial monolayers may be deposited (e.g., those that will not entirely cover the substrate). The number of monolayers may be controlled by controlling the number of ALD cycles.

Because the dosing can be controlled by the number of monolayers used, the size of the atom can be taken into account. As a general rule, the smaller the atom size of the dopant, the higher the dosage per monolayer because smaller atoms have a higher surface density. Table 1 below demonstrates this, by comparing the covalent radius of several common dopants, and showing their surface density for hexagonal packing and body centered cubic (bcc) packing.

TABLE 1

Surface Density Based on Atomic Size

| Dopant | Covalent Radius (A)/Atomic Mass | Surface Density for hexagonal packing (atoms/cm$^2$) | Surface Density for bcc packing (atoms/cm$^2$) |
|---|---|---|---|
| B—B | 0.85 (11) | 3.9955E+15 | 3.46021E+15 |
| P—P | 1 (31) | 2.88675E+15 | 2.5E+15 |
| As—As | 1.15 (75) | 2.1828E+15 | 1.89036E+15 |
| S—S | 1 (32) | 2.74765E+15 | 2.37954E+15 |
| Si—Si | 1.11 (28) | 2.61837E+15 | 2.26757E+15 |

As shown in Table 1, the dopant atom size can be used to determine the dose that is possible with each monolayer of the dopant species. For example, smaller atoms such as Boron can result in almost twice the dose per monolayer as compared to arsenic, which has a larger bond length.

Another parameter than can be taken into account in determining the doping scheme is the surface orientation of the substrate to be doped, as this affects the maximum numbers of atoms which can bond to the surface. Different surface orientation which are utilized in a FinFET device, result in different density of atoms of the surface. Table 2 shows how the surface density of atoms varies with surface orientation for silicon, germanium and indium arsenic.

TABLE 2

Surface Density Based on Surface Orientation

| Surface Orientation | Surface Density of Atoms (Atoms/cm$^2$) |
|---|---|
| Si (100) | 6.78313E+14 |
| Si (110) | 4.7964E+14 |
| Si (111) | 9.79061E+14 |
| Ge (100) | 6.28741E+14 |
| Ge (110) | 4.44587E+14 |
| Ge (111) | 9.07509E+14 |
| InAs (100) | 5.44969E+14 |

As shown in Table 2, a surface with (111) orientation has approximately twice the density of atoms on the surface compared to the (100) surface. This can be used to determine how many atoms of the first monolayer of a dopant layer can bond to the substrate and can also play a role in the in-diffusion of these atoms into the fin.

According to one or more embodiments, dopant density per unit volume can be increased as the feature dimensions are scaled. With demands for smaller features, the fins are expected to become taller and thinner. This scaling results in more surface area/volume of the device. As the dose per surface area is fixed for a given number of monolayers in this scheme an increase in surface-area/volume ratio results in an increase of the dopant concentration which can be achieved using this scheme.

This principle is demonstrated in FIGS. 2A and 2B, which show substrates of different dimensions. FIGS. 2A and 2B each contain a shallow trench isolation area 220 and 250, respectively. The substrate 230 of FIG. 2B is taller and thinner than the substrate 200 of FIG. 2A. As seen in FIG. 2B, the number of dopants 240 per volume unit of fin increases as compared to the dopants 210 of FIG. 2A.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Equipment may be selected according to the specific circumstances. In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma According to one or more embodiments, the substrate is subjected to processing prior to after forming the dielectric layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation or carbon contamination prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

It is contemplated that the methods described herein may be practiced using other cluster tools having suitable process chambers coupled thereto.

Figure 3:
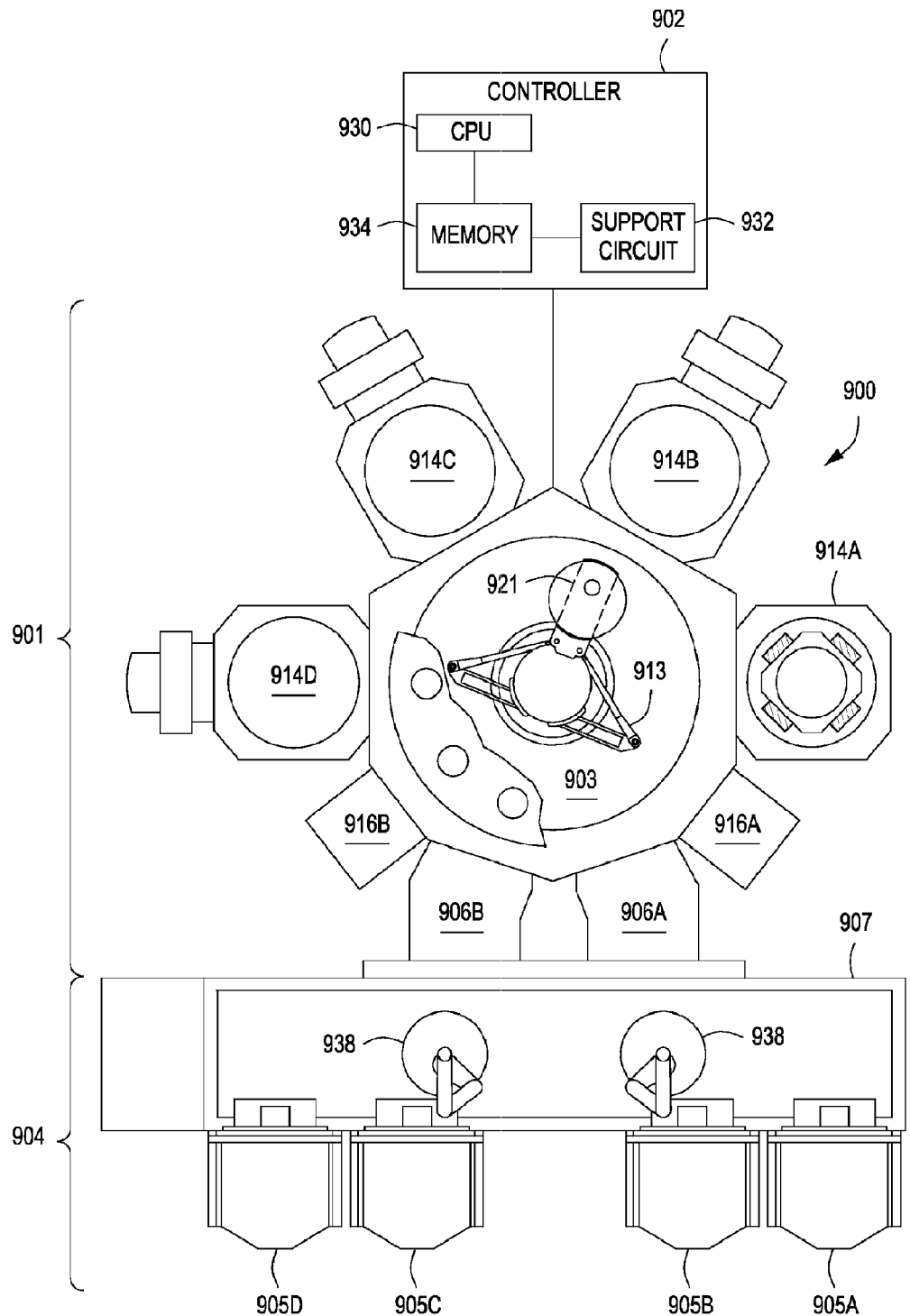
FIG. 3 shows an integrated cluster tool according to one or more embodiments of the invention.

An example of an integrated tool is shown in FIG. 3. The integrated tool 900 includes a vacuum-tight processing platform 901, a factory interface 904, and a system controller 902. The platform 901 comprises multiple processing chambers, such as 914A, 914B, 914C, and 914D operatively coupled to a vacuum substrate transfer chamber 903. The factory interface 904 is operatively coupled to the transfer chamber 903 by one or more load lock chambers (two load lock chambers, such as 906A and 906B shown in FIG. 3).

In some embodiments, the factory interface 904 comprises at least one docking station 907, at least one factory interface robot 938 to facilitate the transfer of the semiconductor substrates. The docking station 907 is configured to accept one or more front opening unified pod (FOUP). Four FOUPS, such as 905A, 905B, 905C, and 905D are shown in the embodiment of FIG. 3. The factory interface robot 938 is configured to transfer the substrates from the factory interface 904 to the processing platform 901 through the loadlock chambers, such as 906A and 906B. Each of the loadlock chambers 906A and 906B have a first port coupled to the factory interface 904 and a second port coupled to the transfer chamber 903. The load lock chamber 906A and 906B are coupled to a pressure control system (not shown) which pumps down and vents the chambers 906A and 906B to facilitate passing the substrates between the vacuum environment of the transfer chamber 903 and the substantially ambient (e.g., atmospheric) environment of the factory interface 904. The transfer chamber 903 has a vacuum robot 913 disposed therein. The vacuum robot 913 is capable of transferring substrates 921 between the load lock chamber 906A and 906B and the processing chambers 914A, 914B, 914C, and 914D.

In some embodiments, the processing chambers 914A, 914B, 914C, and 914D, are coupled to the transfer chamber 903. The processing chambers 914A, 914B, 914C, and 914D comprise at least one of an ALD chamber, a deposition chamber for depositing the capping oxide and/or an anneal chamber for driving and activating the dopants in the substrate.

In some embodiments, one or more optional service chambers (shown as 916A and 916B) may be coupled to the transfer chamber 903. The service chambers 916A and 916B may be configured to perform other substrate processes, such as degassing, orientation, substrate metrology, cool down and the like, or alternatively maybe be equivalent to any of the process chambers 914A-D.

Embodiments using a cluster tool can be particularly advantageous between depositing the layer of dopants and depositing the dielectric layer, and between depositing the dielectric layer and anneal. In one or more embodiments, there is break in the vacuum (e.g., no exposure to ambient conditions) between either of these processes. This can help to preserve the integrity of dopant atoms on the semiconductor surface.

FIG. 6 depicts a method 600 according to one or more embodiments of the invention. The dopant dose can be first determined by the selected dopant atom and the number of ALD cycles 610. Then, the dopant atoms are deposited onto the semiconductor 620. Next, the semiconductor surface may be capped with a selected dielectric layer 630. Then, the semiconductor surface may be annealed to drive the dopants into the semiconductor 640. Optionally, two or more of these steps are done in a cluster tool without breaking vacuum and/or being exposed to ambient conditions.

EXAMPLES

Example 1

Doping profiles were simulated for a doping method according to one or more embodiments of the invention (referred to "ALD doping") and one using a conventional ion implantation scheme, both for doping with arsenic. TCAD simulations were performed depicting the process flow, and the diffusion was modeled for a 1050° C., 30 second anneal.

For the ALD doping scheme 3 monolayers of arsenic are deposited on the surface while for the ion implant scheme similar dose of arsenic atoms are ion implanted into the substrate. Very high level of activation>1+E 21/cm$^3$ can be achieved with a sharp profile with the ALD scheme. As the ALD doping scheme produces no implant induced damage it results in a much sharper doping profile and reduced junction depth as shown in FIG. 4.

While FIG. 4 plots the number for arsenic doping, the numbers for a smaller atom, such as boron, are can be much higher given the higher dose/monolayer, as discussed above. The higher surface concentration which comes from the dopant source being located on the surface should also lead to improvement in contact resistance, which can be especially important for dopants like phosphorous which tend to deplete away from surface with conventional schemes such as ion implantation. Also a lower junction leakage is expected as this scheme is free of implant and/or radiation damage, which is associated with implant and/or plasma doping schemes respectively.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of doping a semiconductor feature, the method comprising:
   providing a substrate having at least one feature having an aspect ratio;
   depositing a layer of dopants onto the substrate, wherein the layer of dopants comprises one or more monolayers, and the layer of dopants has a shape conforming to the at least one feature;
   depositing a dielectric layer onto the layer of dopants, the dielectric layer having a shape conforming to the layer of dopants, wherein deposition of the dielectric layer is carried out at a temperature of less than about 300° C.; and
   annealing the dielectric layer to diffuse the dopants into the substrate.

2. The method of claim 1, wherein the one or more monolayers each consists of a single layer of dopant atoms and the dose per monolayer is determined at least by the atom size of the dopants.

3. The method of claim 1, wherein the dopants comprise one or more of boron, phosphorous, arsenic, silicon, or combinations thereof.

4. The method of claim 1, wherein the deposition of the layer of dopants comprises atomic layer deposition or plasma-enhanced atomic layer deposition.

5. The method of claim 1, wherein the dielectric layer comprises SiN, $SiO_2$, $Al_2O_3$, or $HfO_2$, and is deposited via atomic layer deposition, chemical vapor deposition, or sputtering.

6. The method of claim 1, wherein the semiconductor feature is a FinFET transistor.

7. The method of claim 1, which further comprises calculating a number of monolayers to provide a desired dopant density per unit volume based on the atomic size of the dopant atom and the surface area/volume ratio of the semiconductor feature, and depositing the calculated number of monolayers to provide the desired dopant density.

8. The method of claim 7, wherein calculating the number of monolayers to provide a desired dopant density per unit volume is further based on surface orientation in addition to the atomic size of the dopant atom and the surface area/volume ratio, and each monolayer is deposited by a single atomic layer deposition cycle.

9. The method of claim 1, wherein deposition of the layer of dopants and deposition of the dielectric layer occur without a break in vacuum.

10. The method of claim 1, further comprising implanting silicon or argon into the dielectric layer prior to annealing the dielectric layer.

11. The method of claim 1, wherein the dopants are diffused into the substrate to a predetermined depth, and the predetermined depth is calculated using the aspect ratio.

12. A method of doping a semiconductor feature, the method comprising:
providing a substrate having at least one feature having an aspect ratio;
depositing a layer of dopants onto the substrate, the layer of dopants having a shape conforming to the at least one feature;
depositing a dielectric layer onto the layer of dopants, the dielectric layer having a shape conforming to the layer of dopants, wherein deposition of the dielectric layer is carried out at a temperature of less than about 300° C.; and
annealing the dielectric layer to diffuse the dopants into the substrate, wherein substantially all of the dopants are diffused into the substrate less than 0.05 nm from the surface.

* * * * *